(12) United States Patent
Yamashita et al.

(10) Patent No.: US 6,670,252 B2
(45) Date of Patent: Dec. 30, 2003

(54) METHOD OF MANUFACTURING SEMICONDUCTOR DEVICE

(75) Inventors: Yasunori Yamashita, Tokyo (JP); Kenichi Hatasako, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/184,914

(22) Filed: Jul. 1, 2002

(65) Prior Publication Data

US 2003/0143826 A1 Jul. 31, 2003

(30) Foreign Application Priority Data

Jan. 30, 2002 (JP) .......................... 2002-021588

(51) Int. Cl.⁷ .............................................. H01L 21/336
(52) U.S. Cl. ..................... 438/303; 438/595; 257/335
(58) Field of Search ................. 438/303, FOR 175, 438/FOR 190, 595, 696; 257/21.345, 21.436, 335, 336

(56) References Cited

U.S. PATENT DOCUMENTS

| | | | | | |
|---|---|---|---|---|---|
| 5,234,852 | A | * | 8/1993 | Liou | 438/303 |
| 5,428,240 | A | * | 6/1995 | Lur | 257/389 |
| 5,811,342 | A | * | 9/1998 | Wu | 438/303 |
| 6,420,273 | B1 | * | 7/2002 | Lin | 438/706 |
| 6,436,800 | B1 | * | 8/2002 | Kuo et al. | 438/558 |
| 6,455,388 | B1 | * | 9/2002 | Lai et al. | 438/303 |
| 6,461,982 | B2 | * | 10/2002 | DeBoer et al. | 438/778 |

FOREIGN PATENT DOCUMENTS

| | | |
|---|---|---|
| JP | 3-96271 | 4/1991 |
| JP | 5-109992 | 4/1993 |
| JP | 8-102504 | 4/1996 |

* cited by examiner

*Primary Examiner*—George Fourson
*Assistant Examiner*—Fernando Toledo
(74) *Attorney, Agent, or Firm*—Oblon, Spivak, McClelland, Maier & Neustadt, P.C.

(57) ABSTRACT

A method of manufacturing a semiconductor device which reduces the number of impurity implantations. A buffer film for reducing a quantity of an impurity implantation is provided adjacent to an MIS gate structure over a surface of a semiconductor substrate, and an impurity implantation is carried out over the semiconductor substrate, through the buffer film in a first predetermined region in which the buffer film is provided and directly in a second predetermined region of the substrate. An impurity concentration is reduced in a the first predetermined region in which the impurity implantation is carried out through the buffer film, while the impurity concentration is increased in the second predetermined region in which the buffer film is not provided. Accordingly, a plurality of regions having different impurity concentrations are formed as a source/drain of an MISFET by a one-time impurity implantation. Consequently, the number of the impurity implantations is reduced.

12 Claims, 17 Drawing Sheets

F I G. 29
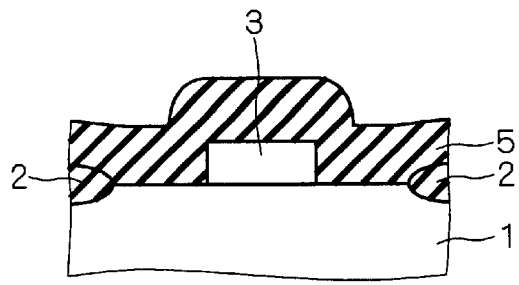
F I G. 30
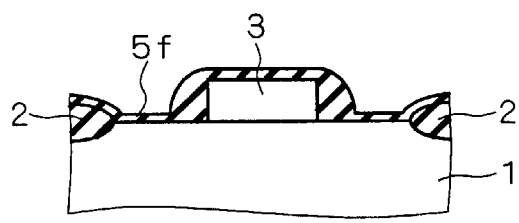
F I G. 31
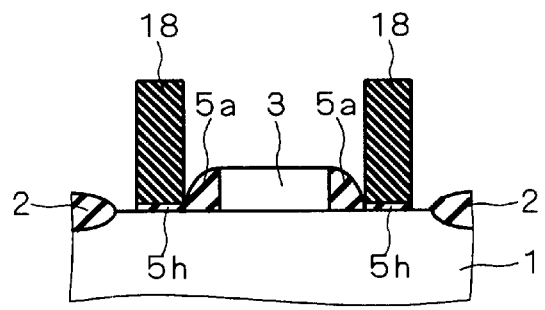
F I G. 32
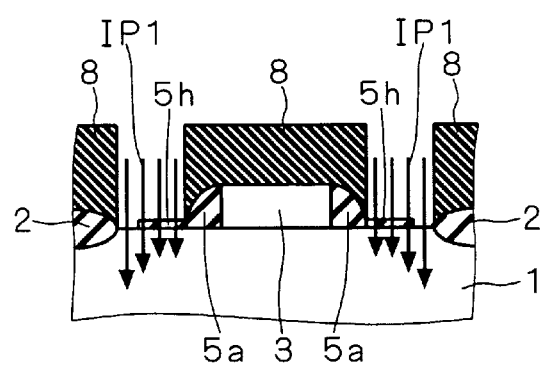

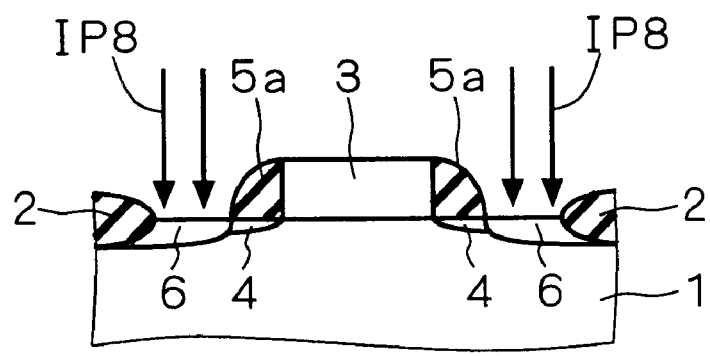
F I G. 65

METHOD OF MANUFACTURING SEMICONDUCTOR DEVICE

BACKGROUND OF THE INVENTION

1. Field of the Invention

The present invention relates to a method of manufacturing a semiconductor device having an MISFET (Metal Insulator Semiconductor Field Effect Transistor).

2. Description of the Background Art

FIGS. 62 to 65 are views showing a process for manufacturing the MISFET. As shown in FIG. 62, first of all, an impurity implantation IP7 is carried out over a surface of a semiconductor substrate 1 provided with an isolation region 2 and an MIS gate structure (a multilayer structure of a gate electrode and a gate insulating film) 3. Consequently, an LDD (Lightly Doped Drain) region 4 is formed.

Next, an insulating film 5 such as a silicon oxide film is formed on the semiconductor substrate 1 (FIG. 63) and is etched. Consequently, a side wall 5a is formed on both side surfaces of the MIS gate structure 3 (FIG. 64).

Then, an impurity implantation IP8 is carried out over the surface of the semiconductor substrate 1 again. Consequently, a source/drain region 6 is formed (FIG. 65).

In the method of manufacturing a semiconductor device according to the conventional art, the impurity implantation is to be carried out in each of the step of forming the LDD region 4 and the step of forming the source/drain region 6. Therefore, the manufacturing process is complicated.

SUMMARY OF THE INVENTION

It is an object of the present invention to provide a method of manufacturing a semiconductor device capable of reducing the number of impurity implantations.

According to the present invention, a method of manufacturing a semiconductor device includes the following steps of (a) to (d). At the step (a), a semiconductor substrate having an MIS (Metal Insulator Semiconductor) gate structure formed on a surface is prepared. At the step (b), a buffer film for reducing a quantity of an impurity implantation is provided in a portion which is adjacent to the MIS gate structure over the surface of the semiconductor substrate. At the step (c), an impurity is implanted into the semiconductor substrate, through the buffer film in a portion in which the buffer film is provided, in a predetermined region including the buffer film. At the step (d), the buffer film is removed.

The impurity implantation is carried out over the semiconductor substrate, through the buffer film in the portion in which the buffer film is provided, in the predetermined region including the buffer film. Accordingly, in the case in which the buffer film is provided in a part of the predetermined region, an impurity concentration is reduced in the portion in which the impurity implantation is carried out through the buffer film, while the impurity concentration is increased in a portion in which the buffer film is not provided. Consequently, a plurality of regions having different impurity concentrations can be formed as a source/drain of an MISFET by a one-time impurity implantation so that the number of impurity implantations can be reduced.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 29 to 32 are views showing a method of manufacturing a semiconductor device according to a seventh embodiment, FIGS. 62 to 65 are views showing a method of manufacturing a semiconductor device according to the conventional art.

DESCRIPTION OF THE PREFERRED EMBODIMENTS

<First Embodiment>

The present embodiment provides a method of manufacturing a semiconductor device in which a buffer film for reducing a quantity of an impurity implantation is provided on a side of an MIS gate structure over a surface of a semiconductor substrate and an impurity is implanted into the semiconductor substrate, through the buffer film in a portion in which the buffer film is provided. An impurity concentration is reduced in a portion in which the impurity implantation is carried out through the buffer film, while the impurity concentration is increased in a portion in which the buffer film is not provided. Accordingly, a plurality of regions having different impurity concentrations can be formed as a source/drain of an MISFET by a one-time impurity implantation. Consequently, the number of impurity implantations can be reduced.

Figure 1:
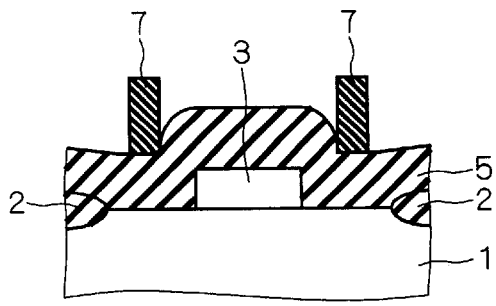
FIGS. 1 to 4 are views showing a method of manufacturing a semiconductor device according to a first embodiment.

FIGS. 1 to 4 are views showing a method of manufacturing a semiconductor device according to the present embodiment. First of all, a semiconductor substrate 1 such as a silicon substrate having an isolation region 2 and an MIS gate structure 3 formed thereon is prepared. Then, an insulating film 5 such as a silicon oxide film is formed over the whole surface. Next, a photoresist 7 is formed on the insulating film 5 and is subjected to patterning (FIG. 1).

Figure 2:
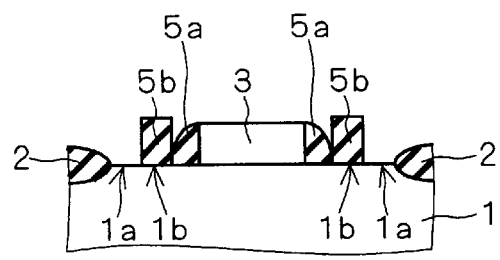

Subsequently, anisotropic etching is carried out by using the photoresist 7 as a mask so that the insulating film 5 is selectively subjected to patterning. Consequently, a side wall 5a and a buffer film 5b are formed. Then, the photoresist 7 is removed (FIG. 2).

A part of the surface of the semiconductor substrate 1 which is adjacent to the side wall 5a is divided into a region 1b in which the buffer film 5b is provided and a region 1a in which the buffer film 5b is not provided. The side wall 5a and the buffer film 5b are provided on both of two opposed sides of the MIS gate structure 3.

Figure 3:
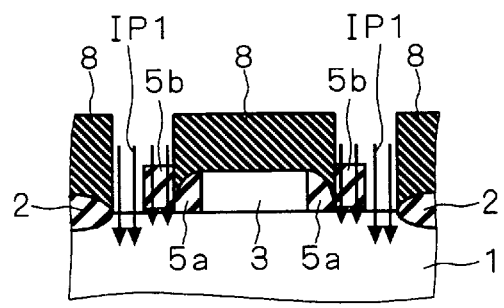

Next, a photoresist 8 to be a mask is formed on the surface of the semiconductor substrate 1 and is subjected to patterning so as to cover a portion in which an impurity should not be implanted. Then, an impurity implantation IP1 is carried out (FIG. 3). In the portion (region 1b) in which the buffer film 5b is provided, the impurity implantation is carried out through the buffer film 5b. Moreover, the impurity implantation is also carried out over the outside portion (region 1a) of the buffer film 5b seen from the MIS gate structure 3. Consequently, an LDD region 4 and a source/drain region 6 are formed.

Figure 4:
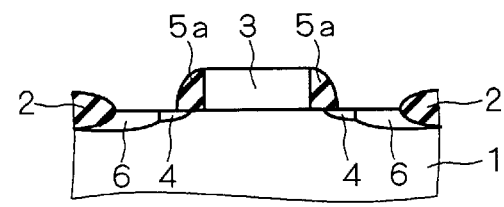

Subsequently, the buffer film 5b is removed by using the photoresist 8 through wet etching, for example. Then, the photoresist 8 is removed (FIG. 4).

According to the method of manufacturing a semiconductor device in accordance with the present embodiment, an impurity is implanted into the semiconductor substrate 1, through the buffer film 5b in the portion provided with the buffer film 5b, in the regions 1a and 1b. Accordingly, an impurity concentration is reduced in the portion (region 1b) in which the impurity implantation is carried out through the buffer film 5b, while the impurity concentration is increased in the portion (region 1a) in which the buffer film 5b is not provided. Accordingly, a plurality of regions 4 and 6 having different impurity concentrations can be formed as the source/drain of the MISFET by a one-time impurity implantation. Consequently, the number of impurity implantations can be reduced.

Moreover, the impurity implantation IP1 is also carried out over the outside portion of the buffer film 5b seen from the MIS gate structure 3. Accordingly, it is possible to manufacture an MISFET having a source/drain constituted by a plurality of regions having different impurity concentrations.

Furthermore, the buffer film 5b is also provided on both of two opposed sides of the MIS gate structure 3. Accordingly, the impurity implantation is carried out over the outside portion of the buffer film 5b in the surface of the semiconductor substrate 1 as seen from the MIS gate structure 3. Consequently, it is possible to manufacture an MISFET having both a source and a drain constituted by a plurality of regions having different impurity concentrations.

Moreover, a film is formed over the whole surface of the semiconductor substrate 1 and is then subjected to patterning selectively by a photolithography technique and an etching technique. Consequently, the buffer film 5b is formed. Thus, the buffer film 5b can be formed in only a necessary portion.

When the impurity implantation is to be carried out, furthermore, the photoresist 8 to be a mask is provided in the portion in which the impurity should not be implanted. In the same portion, accordingly, the photoresist 8 prevents the impurity implantation.

Figure 63:
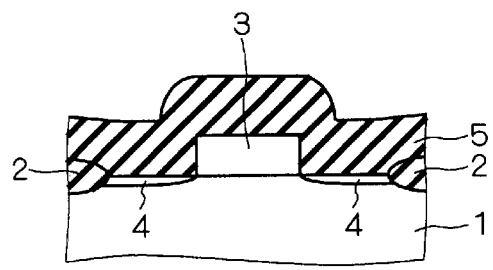
Figure 64:
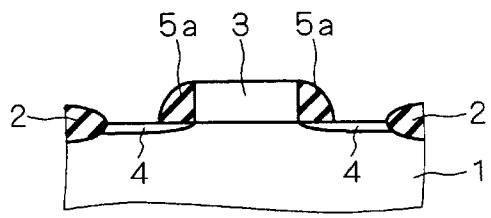

While the LDD region 4 and the source/drain region 6 are simultaneously formed in order to reduce the number of the impurity implantations in the present embodiment, the photoresist 7 may be provided in the structure shown in FIG. 63 to form the buffer film 5b and the source/drain having a difference in a concentration in three stages may be subsequently formed in the same manner as described above, for example.

<Second Embodiment>

The present embodiment is a variant of the first embodiment, in which the same buffer film as that in the first embodiment is utilized for manufacturing a high voltage MISFET. The high voltage MISFET is a device in which a wide drain region is formed (a wide offset region is formed in place of an LDD region) and a spread of a depletion layer can be controlled by making a difference in an impurity concentration in the offset region. If the difference in the impurity concentration is set to be small in the offset region, the spread of the depletion layer can be controlled more precisely. Therefore, a breakdown voltage can be enhanced.

Figure 5:
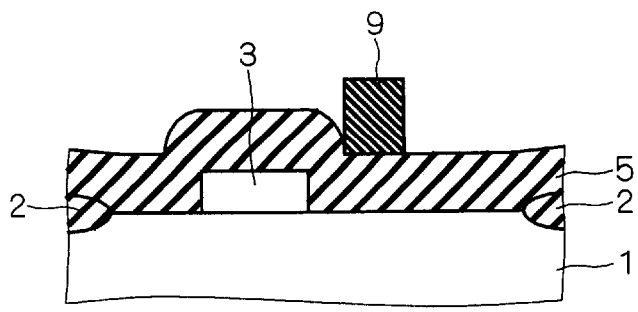
FIGS. 5 to 10 are views showing a method of manufacturing a semiconductor device according to a second embodiment.

FIGS. 5 to 10 are views showing a method of manufacturing a semiconductor device according to the present embodiment. First of all, a semiconductor substrate 1 such as a silicon substrate having an isolation region 2 and an MIS gate structure 3 formed thereon is prepared. Then, an insulating film 5 such as a silicon oxide film is formed over the whole surface. Next, a photoresist 9 is formed on the insulating film 5 and is subjected to patterning (FIG. 5).

Figure 6:
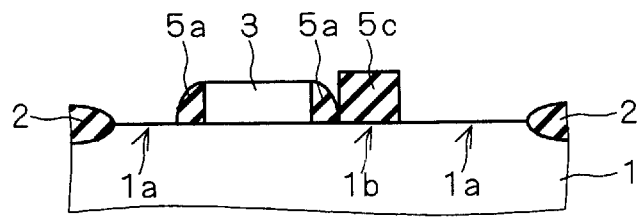

Subsequently, anisotropic etching is carried out by using the photoresist 9 as a mask so that the insulating film 5 is selectively subjected to patterning. Consequently, a side wall 5a and a buffer film 5c are formed. Then, the photoresist 9 is removed (FIG. 6). The buffer film 5c is provided on only one of sides of the MIS gate structure 3.

Figure 7:
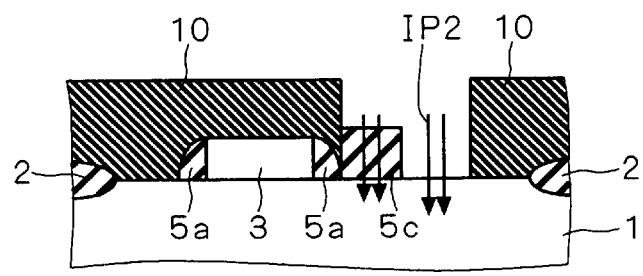

Next, a photoresist 10 to be a mask is formed on the surface of the semiconductor substrate 1 and is subjected to patterning to cover a portion in which an impurity should not be implanted. Then, an impurity implantation IP2 is carried out (FIG. 7). In a portion in which the buffer film 5c is provided, the impurity implantation is carried out through the buffer film 5c. Moreover, the impurity implantation is also carried out over an outside portion of the buffer film 5c seen from the MIS gate structure 3. Consequently, offset regions 4a and 4b are formed. As a matter of course, the offset region 4b has a higher impurity concentration than that of the offset region 4a.

Figure 8:
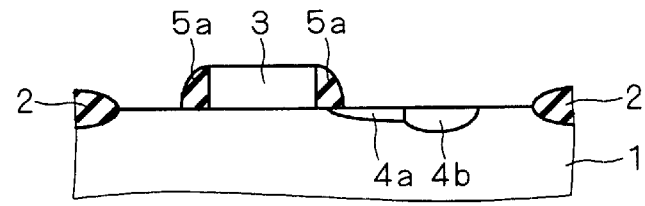
Figure 9:
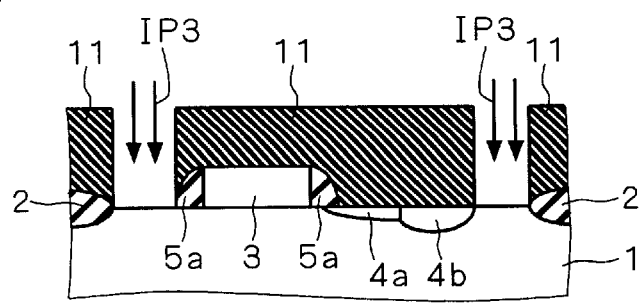
Figure 10:
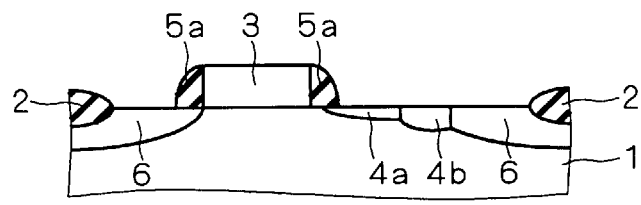

Subsequently, the buffer film 5c is removed by using the photoresist 10 through wet etching, for example. Then, the photoresist 10 is removed (FIG. 8). Thereafter, a photoresist 11 is formed over the whole surface to carry out pattering to be a mask for forming a source/drain. Subsequently, an impurity implantation IP3 is carried out (FIG. 9). Consequently, a source/drain region 6 is formed (FIG. 10). The source/drain region 6 has a higher impurity concentration than that of the offset region 4b.

According to the present embodiment, the buffer film 5c is provided on only one of the sides of the MIS gate structure 3. Accordingly, the impurity implantation is carried out in the outside portion of the buffer film 5c seen from the MIS gate structure 3 and the other side portion of the MIS gate structure 3 over the surface of the semiconductor substrate 1. Consequently, it is possible to manufacture a high voltage MISFET having a drain constituted by a plurality of regions 4a, 4b and 6 having different impurity concentrations.

<Third Embodiment>

The present embodiment is a variant of the second embodiment. While the formation of the source/drain region 6 is carried out separately for the offset regions 4a and 4b in the second embodiment, one offset region is omitted to simultaneously carry out the formation in the present embodiment.

Figure 11:
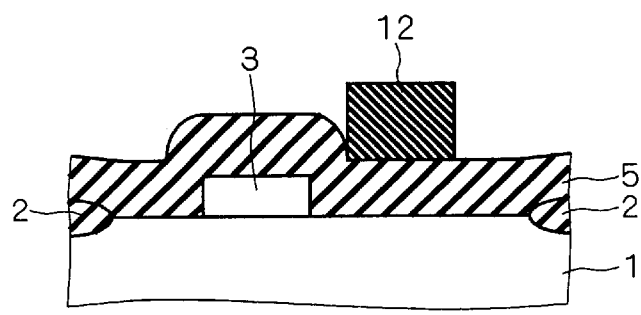
FIGS. 11 to 14 are views showing a method of manufacturing a semiconductor device according to a third embodiment.

FIGS. 11 to 14 are views showing a method of manufacturing a semiconductor device according to the present embodiment. First of all, a semiconductor substrate 1 such as a silicon substrate having an isolation region 2 and an MIS gate structure 3 formed thereon is prepared. Then, an insulating film 5 such as a silicon oxide film is formed over the whole surface. Next, a photoresist 12 is formed on the insulating film 5 and is subjected to patterning (FIG. 11).

Figure 12:
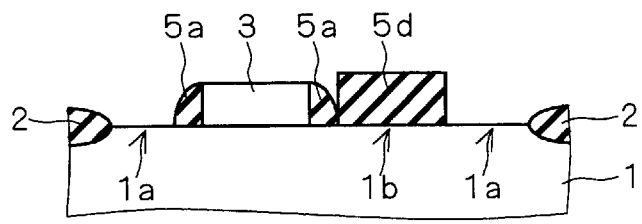

Subsequently, anisotropic etching is carried out by using the photoresist 12 as a mask so that the insulating film 5 is selectively subjected to patterning. Consequently, a side wall 5a and a buffer film 5d are formed. Then, the photoresist 12 is removed (FIG. 12).

Figure 13:
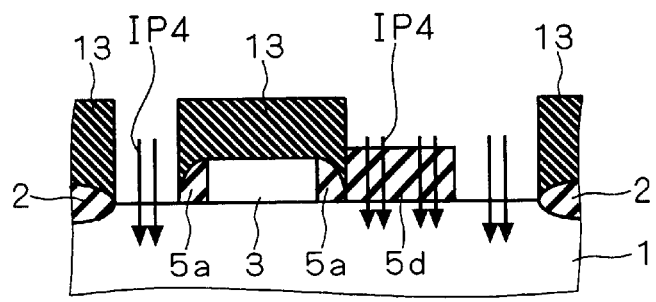
Figure 14:
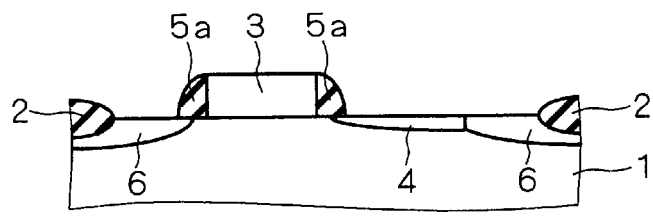

Next, a photoresist 13 to be a mask is formed on the surface of the semiconductor substrate 1 and is subjected to patterning to cover a portion in which an impurity should not be implanted. Then, an impurity implantation IP4 is carried out (FIG. 13). In a portion in which the buffer film 5d is provided, the impurity implantation is carried out through the buffer film 5d. Moreover, the impurity implantation is also carried out over an outside portion of the buffer film 5d seen from the MIS gate structure 3 and the other side portion of the MIS gate structure 3. Consequently, an offset region 4 and a source/drain region 6 are formed (FIG. 14). As a matter of course, the source/drain region 6 has a higher impurity concentration than that of the offset region 4.

If one offset region is thus omitted, the offset region 4 and the source/drain region 6 can be formed at the same time and the process can further be reduced.

<Fourth Embodiment>

The present embodiment is a variant of the first embodiment, in which the same buffer film as that of the first embodiment is utilized for manufacturing a high frequency compatible MISFET. The high frequency compatible MISFET can cope with a high frequency signal because an impurity concentration of a channel portion is regulated and a gate length is reduced. Also in the high frequency compatible MISFET, an offset region may be provided on the drain side as in the high voltage MISFET described in the second and third embodiments.

Figure 15:
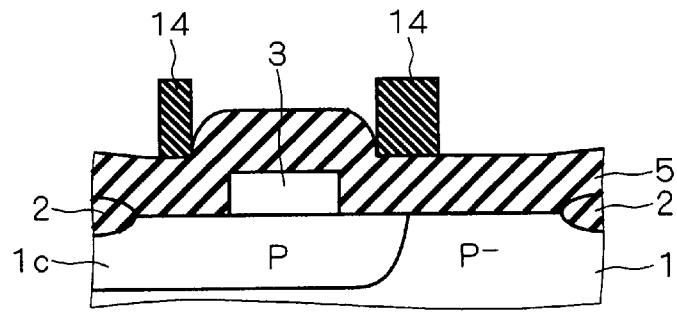
FIGS. 15 to 20 are views showing a method of manufacturing a semiconductor device according to a fourth embodiment.

FIGS. 15 to 20 are views showing a method of manufacturing a semiconductor device according to the present embodiment. First of all, a semiconductor substrate 1 such as a silicon substrate having an isolation region 2 and an MIS gate structure 3 formed thereon is prepared. A high concentration region 1c for regulating an impurity concentration of a channel portion is provided under the MIS gate structure 3 in the semiconductor substrate 1. Then, an insulating film 5 such as a silicon oxide film is formed over the whole surface of the semiconductor substrate 1. Next, a photoresist 14 is formed on the insulating film 5 and is subjected to patterning (FIG. 15).

Figure 16:
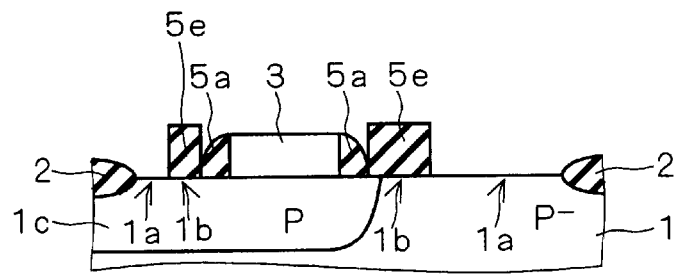

Subsequently, anisotropic etching is carried out by using the photoresist 14 as a mask so that the insulating film 5 is selectively subjected to patterning. Consequently, a side wall 5a and a buffer film 5e are formed. Then, the photoresist 14 is removed (FIG. 16). The side wall 5a and the buffer film 5e are provided on both of two opposed sides of the MIS gate structure 3. Moreover, the buffer film 5e has different widths from each other on the two sides.

Figure 17:
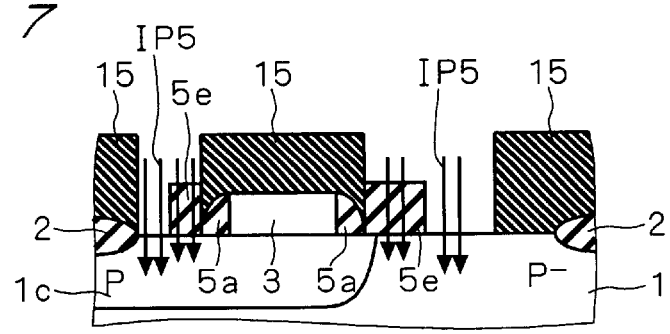

Next, a photoresist 15 to be a mask is formed on the surface of the semiconductor substrate 1 and is subjected to patterning to cover a portion in which an impurity should not be implanted. Then, an impurity implantation IP5 is carried out (FIG. 17). In a portion in which the buffer film 5e is provided, the impurity implantation is carried out through the buffer film 5e. Moreover, the impurity implantation is also carried out over an outside portion of the buffer film 5e seen from the MIS gate structure 3. Consequently, offset regions 4a and 4b are formed. As a matter of course, the offset region 4b has a higher impurity concentration than that of the offset region 4a.

While the offset regions 4a and 4b are widely formed on the drain side, the widths of the offset regions 4a and 4b are reduced on the source side. The offset regions 4a and 4b on the source side simply fulfill the same function as that of an ordinary LDD region.

Figure 18:
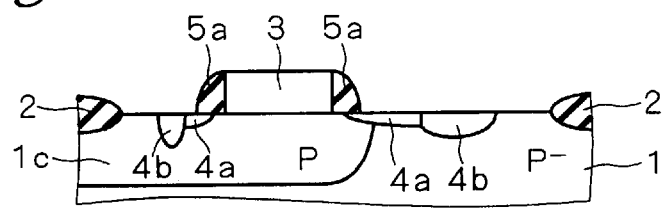
Figure 19:
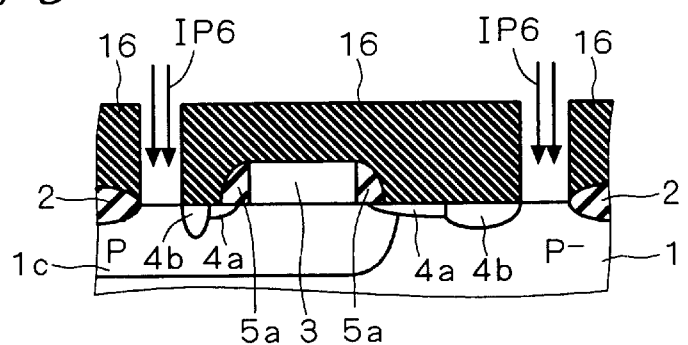
Figure 20:
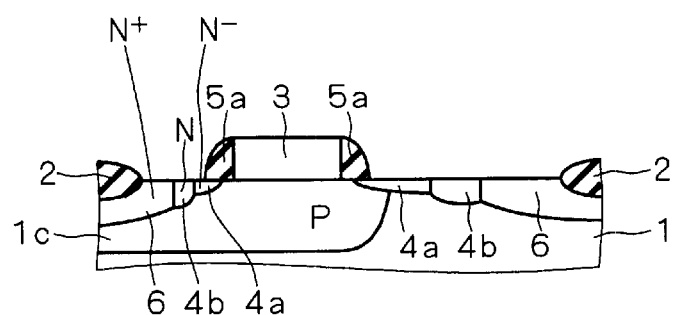

Subsequently, the buffer film 5e is removed by using the photoresist 15 through wet etching, for example. Then, the photoresist 15 is removed (FIG. 18). Thereafter, a photoresist 16 is formed over the whole surface to carry out pattering to be a mask for forming a source/drain. Thereafter, an impurity implantation IP6 is carried out (FIG. 19). Consequently, a source/drain region 6 is formed (FIG. 20). The source/drain region 6 has a higher impurity concentration than that of the offset region 4b.

According to the present embodiment, the buffer film has different widths from each other on the two sides. Accordingly, it is possible to manufacture a high frequency compatible MISFET with a high voltage structure.

<Fifth Embodiment>

The present embodiment is a variant of the fourth embodiment. While the formation of the source/drain region 6 is carried out separately for the offset regions 4a and 4b in the fourth embodiment, one offset region is omitted to simultaneously carry out the formation in the present embodiment.

Figure 21:
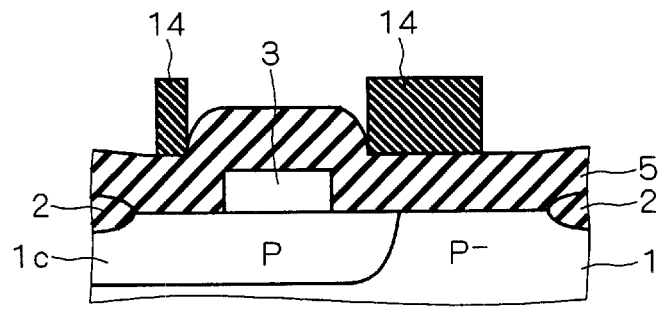
FIGS. 21 to 24 are views showing a method of manufacturing a semiconductor device according to a fifth embodiment.

FIGS. 21 to 24 are views showing a method of manufacturing a semiconductor device according to the present embodiment. First of all, a semiconductor substrate 1 such as a silicon substrate having an isolation region 2 and an MIS gate structure 3 formed thereon is prepared. Then, an insulating film 5 such as a silicon oxide film is formed over the whole surface. Next, a photoresist 14 is formed on the insulating film 5 and is subjected to patterning (FIG. 21).

Figure 22:
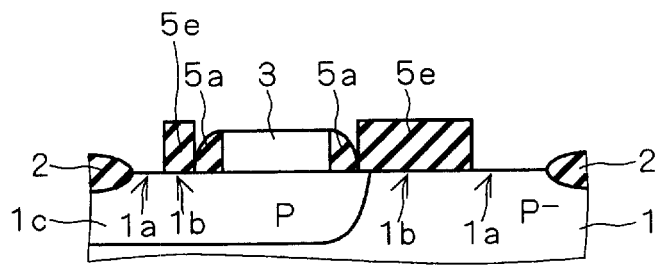

Subsequently, anisotropic etching is carried out by using the photoresist 14 as a mask so that the insulating film 5 is selectively subjected to patterning. Consequently, a side wall 5a and a buffer film 5e are formed. Then, the photoresist 14 is removed (FIG. 22).

Figure 23:
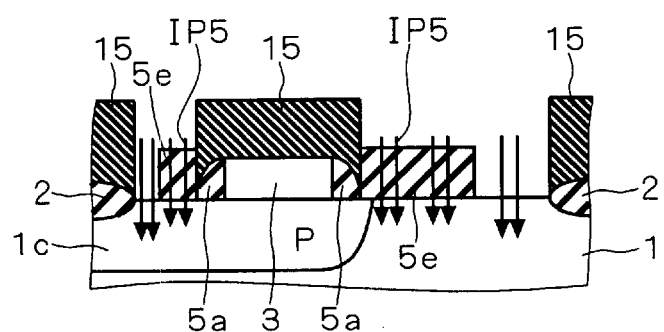

Next, a photoresist 15 to be a mask is formed on the surface of the semiconductor substrate 1 and is subjected to patterning to cover a portion in which an impurity should not be implanted. Then, an impurity implantation IP5 is carried out (FIG. 23). In a portion in which the buffer film 5e is provided, the impurity implantation is carried out through the buffer film 5e. Moreover, the impurity implantation is also carried out over an outside portion of the buffer film 5e seen from the MIS gate structure 3. Consequently, an offset region 4 and a source/drain region 6 are formed. As a matter of course, the source/drain region 6 has a higher impurity concentration than that of the offset region 4.

If one offset region is thus omitted, the offset region 4 and the source/drain region 6 can be formed at the same time and the process can further be reduced.

<Sixth Embodiment>

The present embodiment is a variant of the first embodiment, in which a film is formed and is then etched to reduce a thickness thereof, and patterning is thereafter carried out to form a buffer film. Thus, the buffer film is constituted by a plurality of regions having different thicknesses.

FIGS. 25 to 28 are views showing a method of manufacturing a semiconductor device according to the present embodiment. First of all, a semiconductor substrate 1 such as a silicon substrate having an isolation region 2 and an MIS gate structure 3 formed thereon is prepared. In the same manner as in FIG. 1, then, an insulating film 5 such as a silicon oxide film is formed over the whole surface and a photoresist 7 is then formed on the insulating film 5 and is subjected to patterning.

Figure 25:
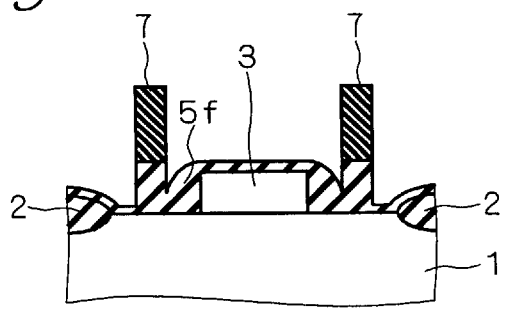
FIGS. 25 to 28 are views showing a method of manufacturing a semiconductor device according to a sixth embodiment.

Subsequently, anisotropic etching is carried out by using the photoresist 7 as a mask so that the insulating film 5 is subjected to patterning selectively. Differently from the case of the first embodiment, a side wall 5a and a buffer film 5b are not completely formed in this stage. More specifically, a part of the insulating film 5 is covered with the photoresist 7 and a thickness of the insulating film 5 is simply reduced (FIG. 25).

Figure 26:
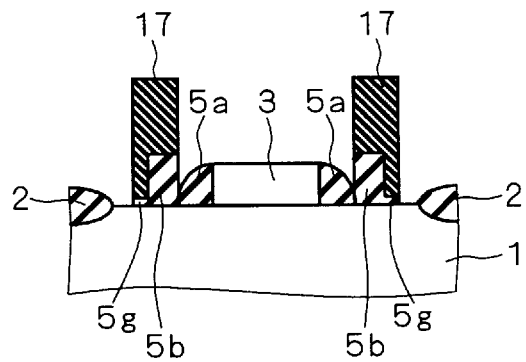

After the photoresist 7 is removed, a photoresist 17 is newly formed such that a portion covered with the photoresist 7 and a thinned film portion adjacent thereto in an insulating film 5f having a thickness reduced are selectively subjected to patterning. Then, anisotropic etching is carried out by using the photoresist 17 as a mask so that the insulating film 5f is selectively subjected to patterning (FIG. 26). Thereafter, the photoresist 17 is removed. Consequently, a side wall 5a and buffer films 5b and 5g are formed. The side wall 5a and the buffer films 5b and 5g are provided on both of two opposed sides of the MIS gate structure 3. Moreover, the buffer film is constituted by the portion 5b having a great thickness and the portion 5g having a small thickness.

Figure 27:
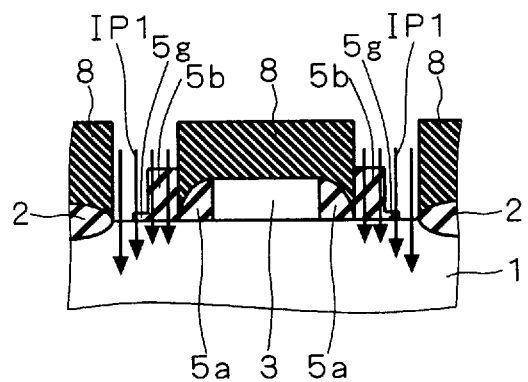

Next, a photoresist 8 to be a mask is formed on the surface of the semiconductor substrate 1 and is subjected to patterning so as to cover a portion in which an impurity should not be implanted. Then, an impurity implantation IP1 is carried out (FIG. 27). The impurity implantation is carried out through the buffer films 5b and 5g in the portions in which the buffer films 5b and 5g are provided. Moreover, the impurity implantation is also carried out in outside portions of the buffer films 5b and 5g seen from the MIS gate structure 3. Consequently, LDD regions 4a and 4b and a source/drain region 6 are formed. The LDD region 4b has a higher impurity concentration than that of the LDD region 4a, and furthermore, the source/drain region 6 has a higher impurity concentration than that of the LDD region 4b.

Figure 28:
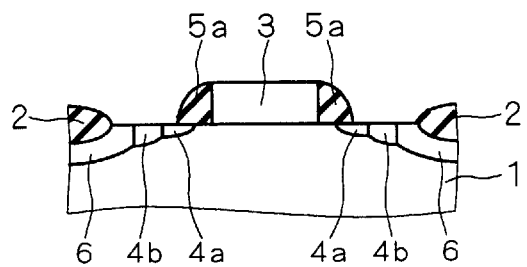

Subsequently, the buffer films 5b and 5g are removed by using the photoresist 8 through wet etching, for example. Then, the photoresist 8 is removed (FIG. 28).

According to the method of manufacturing a semiconductor device in accordance with the present embodiment, the insulating film 5 is formed and is then etched to reduce a thickness thereof and the buffer films 5b and 5g are thereafter subjected to patterning. Consequently, a quantity of the impurity implantation can be varied depending on the thickness of the buffer film 5g.

Moreover, the buffer film is constituted by a plurality of regions 5b and 5g having different thicknesses. Accordingly, an impurity concentration is reduced in the portion in which the impurity implantation is carried out through the region 5b having a great thickness, while the impurity concentration is increased in the portion in which the impurity implantation is carried out through the region 5g having a small thickness. Accordingly, a plurality of regions having different impurity concentrations can be formed as the source/drain of the MISFET by a one-time impurity implantation so that the number of the impurity implantations can be reduced.

In the present embodiment, moreover, the insulating film 5 is formed over the whole surface of the semiconductor substrate 1 and a part of the insulating film 5 is then covered by a photolithography technique and is etched to reduce a thickness thereof, and furthermore, the covered part and a part of the thinned film portion are selectively subjected to patterning by the photolithography technique and an etching technique. Consequently, the buffer films 5b and 5g are formed. Accordingly, it is possible to easily form a plurality of regions 5b and 5g having different thicknesses on the buffer films by the photolithography technique and the etching technique.

<Seventh Embodiment>

The present embodiment is a variant of the sixth embodiment, in which the LDD regions 4a and 4b having a difference in a concentration in the sixth embodiment are reduced to one region.

FIGS. 29 to 32 are views showing a method of manufacturing a semiconductor device according to the present embodiment. First of all, a semiconductor substrate 1 such as a silicon substrate having an isolation region 2 and an MIS gate structure 3 formed thereon is prepared. Then, an insulating film 5 such as a silicon oxide film is formed over the whole surface (FIG. 29). Subsequently, anisotropic etching is carried out to reduce a thickness of the insulating film 5 (FIG. 30).

Then, a photoresist 18 is newly formed such that a portion which is adjacent to the MIS gate structure 3 in an insulating film 5f having a thickness reduced is selectively subjected to patterning. Thereafter, anisotropic etching is carried out by using the photoresist 18 as a mask so that the insulating film 5f is selectively subjected to patterning (FIG. 31). Subsequently, the photoresist 18 is removed. Consequently, a side wall 5a and a buffer film 5h are formed. The side wall 5a and the buffer film 5h are provided on both of two opposed sides of the MIS gate structure 3.

Next, a photoresist 8 to be a mask is formed on the surface of the semiconductor substrate 1 and is subjected to patterning so as to cover a portion in which an impurity should not be implanted. Then, an impurity implantation IP1 is carried out (FIG. 32). The impurity implantation is carried out through the buffer film 5h in the portion in which the buffer film 5h is provided. Moreover, the impurity implantation is also carried out over an outside portion of the buffer film 5h seen from the MIS gate structure 3. Consequently, an LDD region 4 and a source/drain region 6 are formed. The source/drain region 6 has a higher impurity concentration than that of the LDD region 4.

Subsequently, the buffer film 5h is removed by using the photoresist 8 through wet etching, for example. Then, the photoresist 8 is removed. Consequently, the same structure as that in FIG. 4 is obtained.

According to the method of manufacturing a semiconductor device in accordance with the present embodiment, a film is formed over the whole surface of the semiconductor substrate 1 and is then selectively subjected to patterning by a photolithography technique and an etching technique so that the buffer film 5h is formed. Accordingly, the buffer film 5h can be formed in only a necessary portion.

Moreover, the insulating film 5 is formed and is then etched to reduce a thickness thereof and the buffer film 5h is thereafter subjected to patterning. Consequently, a quantity of the impurity implantation can be varied depending on the thickness of the buffer film 5h.

<Eighth Embodiment>

The present embodiment is a variant of the second embodiment, in which a film is formed and is then etched to reduce a thickness thereof, and patterning is thereafter carried out to form a buffer film. Thus, the buffer film is constituted by a plurality of regions having different thicknesses.

FIGS. 33 to 37 are views showing a method of manufacturing a semiconductor device according to the present embodiment. First of all, a semiconductor substrate 1 such as a silicon substrate having an isolation region 2 and an MIS gate structure 3 formed thereon is prepared. In the same manner as in FIG. 5, then, an insulating film 5 such as a silicon oxide film is formed over the whole surface and a photoresist 9 is then formed on the insulating film 5 and is subjected to patterning.

Figure 33:
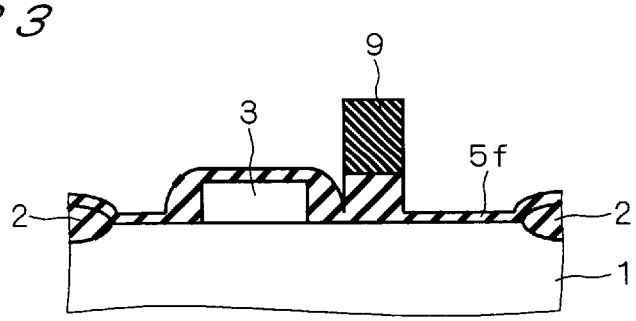
FIGS. 33 to 37 are views showing a method of manufacturing a semiconductor device according to an eighth embodiment.

Subsequently, anisotropic etching is carried out by using the photoresist 9 as a mask so that the insulating film 5 is subjected to patterning selectively. Differently from the case of the second embodiment, a side wall 5a and a buffer film 5c are not completely formed in this stage. More specifically, a part of the insulating film 5 is covered with the photoresist 9 and a thickness of the insulating film 5 is simply reduced (FIG. 33).

Figure 34:
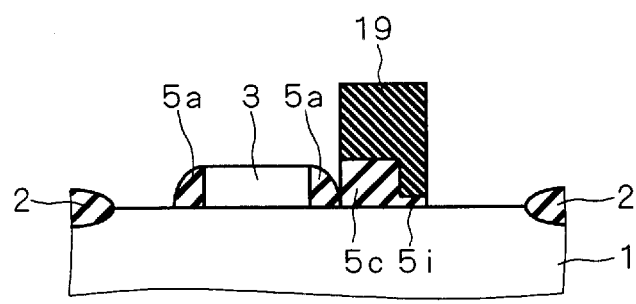

After the photoresist 9 is removed, a photoresist 19 is newly formed such that a portion covered with the photoresist 9 and a thinned film portion adjacent thereto in an insulating film 5f having a thickness reduced are selectively subjected to patterning. Then, anisotropic etching is carried out by using the photoresist 19 as a mask so that the insulating film 5f is selectively subjected to patterning (FIG. 34). Thereafter, the photoresist 19 is removed. Consequently, a side wall 5a and buffer films 5c and 5i are formed. The buffer films 5c and 5i are provided on only one of sides of the MIS gate structure 3. Moreover, the buffer film is constituted by the portion 5c having a great thickness and the portion 5i having a small thickness.

Figure 35:
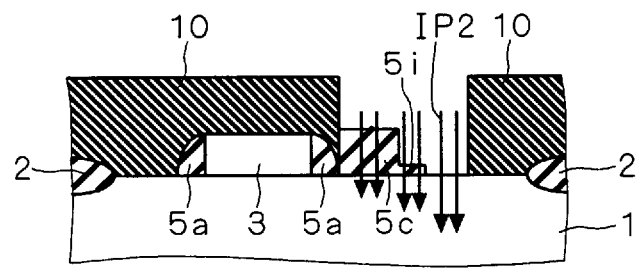

Next, a photoresist 10 to be a mask is formed on the surface of the semiconductor substrate 1 and is subjected to patterning so as to cover a portion in which an impurity should not be implanted. Then, an impurity implantation IP2 is carried out (FIG. 35). The impurity implantation is carried out through the buffer films 5c and 5i in the portions in which the buffer films 5c and 5i are provided. Moreover, the impurity implantation is also carried out in outside portions of the buffer films 5c and 5i seen from the MIS gate structure 3. Consequently, offset regions 4a, 4b and 4c are formed. The offset region 4b has a higher impurity concentration than that of the offset region 4a, and furthermore, the offset region 4c has a higher impurity concentration than that of the offset region 4b.

Figure 36:
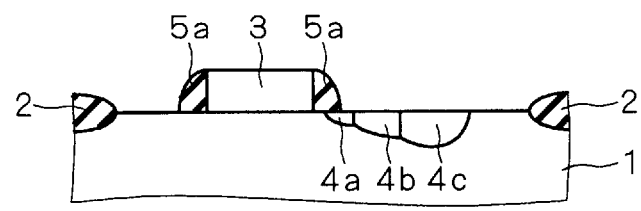
Figure 37:
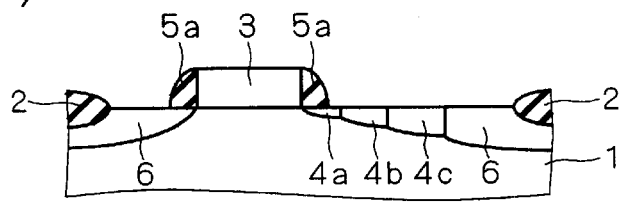

Subsequently, the buffer films 5c and 5i are removed by using the photoresist 10 through wet etching, for example. Then, the photoresist 10 is removed (FIG. 36). In the same manner as in the case of FIG. 9, thereafter, a photoresist is formed over the whole surface and is subjected to patterning to be a mask for forming a source/drain. Subsequently, an impurity implantation is carried out to form a source/drain region 6 (FIG. 37). The source/drain region 6 has a higher impurity concentration than that of the offset region 4c.

According to the method of manufacturing a semiconductor device in accordance with the present embodiment, the insulating film 5 is formed and is then etched to reduce a thickness thereof and the buffer films 5c and 5i are thereafter subjected to patterning. Consequently, a quantity of the impurity implantation can be varied depending on the thickness of the buffer film 5i.

Moreover, the buffer film is constituted by a plurality of regions 5c and 5i having different thicknesses. Accordingly, an impurity concentration is reduced in the portion in which the impurity implantation is carried out through the region 5c having a great thickness, while the impurity concentration is increased in the portion in which the impurity implantation is carried out through the region 5i having a small thickness. Accordingly, a plurality of regions having different impurity concentrations can be formed as an offset region of a high voltage MISFET by a one-time impurity implantation so that the number of the impurity implantations can be reduced.

In the present embodiment, moreover, the insulating film 5 is formed over the whole surface of the semiconductor substrate 1 and a part of the insulating film 5 is then covered by a photolithography technique and is etched to reduce a thickness thereof, and furthermore, the covered part and a part of the thinned film portion are selectively subjected to patterning by the photolithography technique and an etching technique. Consequently, the buffer films 5c and 5i are formed. Accordingly, it is possible to easily form a plurality of regions 5c and 5i having different thicknesses on the buffer films by the photolithography technique and the etching technique.

<Ninth Embodiment>

The present embodiment is a variant of the eighth embodiment, in which the offset regions 4a to 4c having a plurality of differences in a concentration in the eighth embodiment are reduced to two regions.

Figure 38:
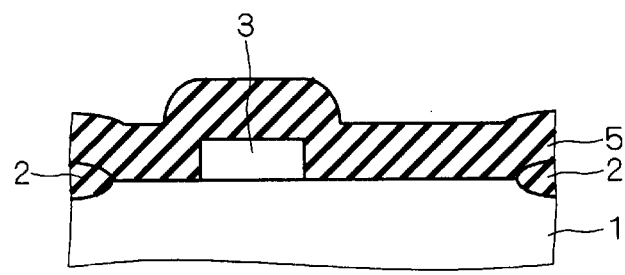
FIGS. 38 to 41 are views showing a method of manufacturing a semiconductor device according to a ninth embodiment.
Figure 39:
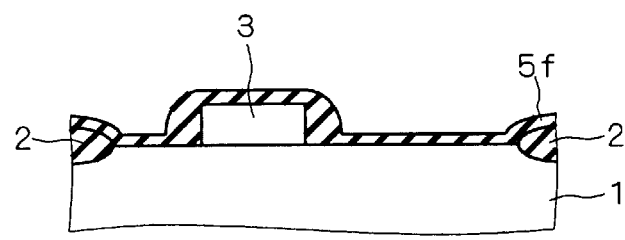

FIGS. 38 to 41 are views showing a method of manufacturing a semiconductor device according to the present embodiment. First of all, a semiconductor substrate 1 such as a silicon substrate having an isolation region 2 and an MIS gate structure 3 formed thereon is prepared. Then, an insulating film 5 such as a silicon oxide film is formed over the whole surface (FIG. 38). Subsequently, anisotropic etching is carried out to reduce a thickness of the insulating film 5 (FIG. 39).

Figure 40:
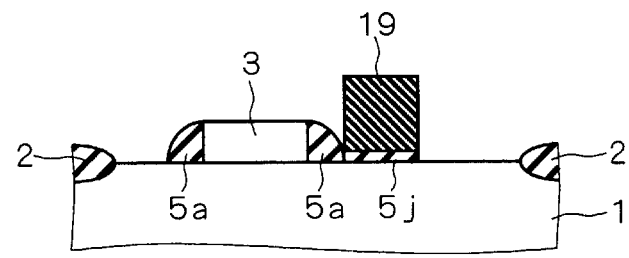

Then, a photoresist 19 is newly formed such that a portion which is adjacent to the MIS gate structure 3 in an insulating film 5f having a thickness reduced is selectively subjected to patterning. Thereafter, anisotropic etching is carried out by using the photoresist 19 as a mask so that the insulating film 5f is selectively subjected to patterning (FIG. 40). Subsequently, the photoresist 19 is removed. Consequently, a side wall 5a and a buffer film 5j are formed. The buffer film 5j is provided on only one of sides of the MIS gate structure 3.

Figure 41:
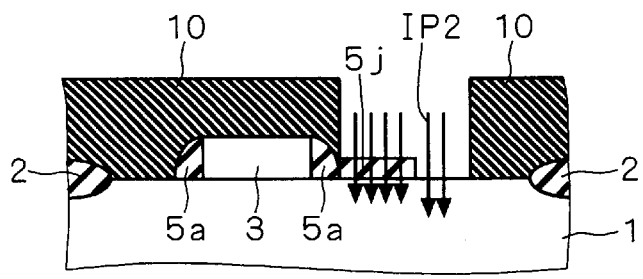

Next, a photoresist 10 to be a mask is formed on the surface of the semiconductor substrate 1 and is subjected to patterning so as to cover a portion in which an impurity should not be implanted. Then, an impurity implantation IP2 is carried out (FIG. 41). The impurity implantation is carried out through the buffer film 5j in the portion in which the buffer film 5j is provided. Moreover, the impurity implantation is also carried out in an outside portion of the buffer film 5j seen from the MIS gate structure 3. Consequently, offset regions 4a and 4b are formed. The offset region 4b has a higher impurity concentration than that of the offset region 4a.

Subsequently, the buffer film 5j is removed by using the photoresist 10 through wet etching, for example. Then, the photoresist 10 is removed. In the same manner as in the case of FIG. 9, thereafter, a photoresist is formed over the whole surface and is subjected to patterning to be a mask for forming a source/drain. Subsequently, an impurity implantation is carried out to form a source/drain region 6. Consequently, the same structure as that in FIG. 10 is obtained.

According to the method of manufacturing a semiconductor device in accordance with the present embodiment, a film is formed over the whole surface of the semiconductor substrate 1 and is then subjected to patterning selectively by a photolithography technique and an etching technique so that the buffer film 5*j* is formed. Accordingly, the buffer film 5*j* can be formed in only a necessary portion.

Moreover, the insulating film 5 is formed and is then etched to reduce a thickness thereof and the buffer film 5*j* is then subjected to patterning. Consequently, a quantity of the impurity implantation can be varied depending on the thickness of the buffer film 5*j*.

<Tenth Embodiment>

The present embodiment is a variant of the ninth embodiment, in which the 10 offset regions 4*a* and 4*b* having a difference in a concentration in the ninth embodiment are further reduced to one region.

Figure 42:
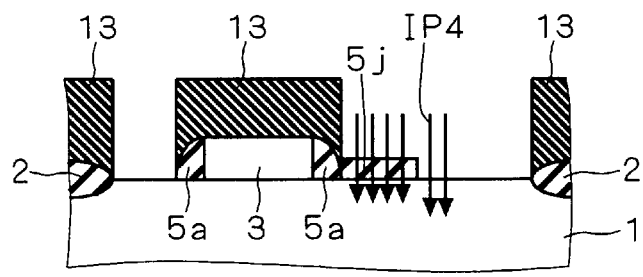
FIG. 42 is a view showing a method of manufacturing a semiconductor device according to a tenth embodiment.

FIG. 42 is a view showing a method of manufacturing a semiconductor device according to the present embodiment. First of all, the structure shown in FIG. 40 is manufactured in the same manner as in the ninth embodiment and a photoresist 19 is removed.

Next, a photoresist 13 to be a mask is formed on a surface of a semiconductor substrate 1 and is subjected to patterning so as to cover a portion in which an impurity should not be implanted. Then, an impurity implantation IP4 is carried out (FIG. 42). The impurity implantation is carried out through a buffer film 5*j* in a portion in which the buffer film 5*j* is provided. Moreover, the impurity implantation is also carried out over an outside portion of the buffer film 5*j* seen from an MIS gate structure 3 and the other side portion of the MIS gate structure 3. Consequently, the same offset region 4 and source/drain region 6 as those in FIG. 14 are formed. The source/drain region 6 has a higher impurity concentration than that of the offset region 4.

If the offset region is thus set to one region, the offset region 4 and the source/drain region 6 can be formed at the same time and the process can further be reduced.

<Eleventh Embodiment>

The present embodiment is a variant of the eighth embodiment, in which a buffer film is constituted by a plurality of regions having different thicknesses and an offset region 4 and a source/drain region 6 can be formed at the same time in the same manner as in the tenth embodiment.

Figure 43:
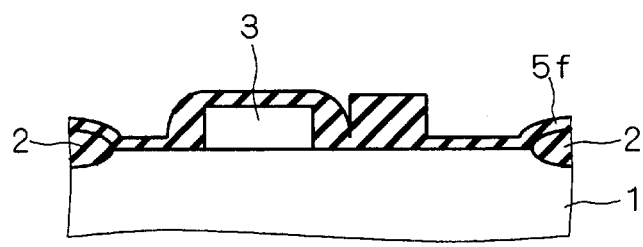
FIGS. 43 to 45 are views showing a method of manufacturing a semiconductor device according to an eleventh embodiment.
Figure 44:
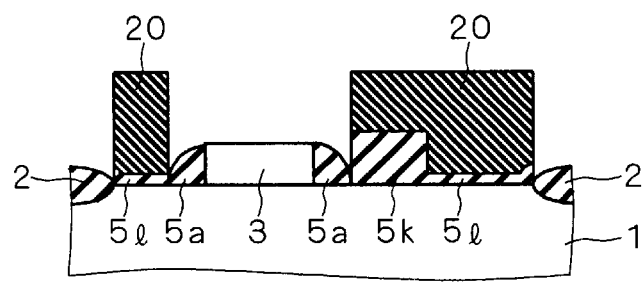
Figure 45:
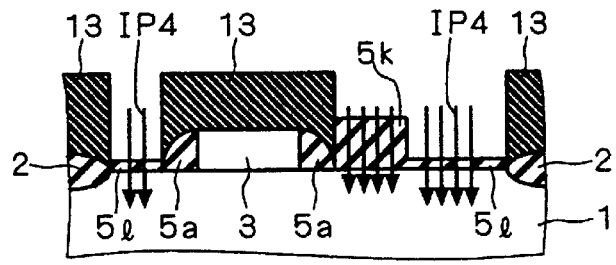
Figure 46:
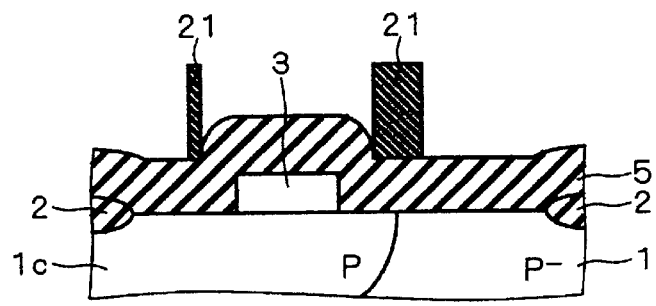
FIGS. 46 to 51 are views showing a method of manufacturing a semiconductor device according to a twelfth embodiment.

FIGS. 43 to 45 are views showing a method of manufacturing a semiconductor device according to the present embodiment. First of all, the structure shown in FIG. 33 is manufactured in the same manner as in the eighth embodiment and a photoresist 9 is removed (FIG. 43).

Then, a photoresist 20 is newly formed such that a portion covered with the photoresist 9 and a thinned film portion adjacent thereto, and furthermore, a thinned film portion on the other opposed sides with an MIS gate structure interposed therebetween in an insulating film 5*f* having a thickness reduced are selectively subjected to patterning. Thereafter, anisotropic etching is carried out by using the photoresist 20 as a mask so that the insulating film 5*f* is selectively subjected to patterning (FIG. 44). Subsequently, the photoresist 20 is removed. Consequently, a side wall 5*a* and buffer films 5*k* and 5*l* are formed. The buffer film 5*k* is provided on only one of the sides of the MIS gate structure 3, and the buffer film 5*l* is provided on both of two opposed sides of the MIS gate structure 3. Moreover, the buffer film is constituted by the portion 5*k* having a great thickness and the portion 5*l* having a small thickness.

Next, a photoresist 13 to be a mask is formed on a surface of a semiconductor substrate 1 and is subjected to patterning so as to cover a portion in which an impurity should not be implanted. Then, an impurity implantation IP4 is carried out (FIG. 45). The impurity implantation is carried out through the buffer films 5*k* and 5*l* in the portions in which the buffer films 5*k* and 5*l* are provided. Consequently, the same offset region 4 and source/drain region 6 as those in FIG. 14 are formed. The source/drain region 6 has a higher impurity concentration than that of the offset region 4.

Even if the buffer film 5*l* is thus provided on both of the two opposed sides of the MIS gate structure 3 and the portion 5*k* having a great thickness is provided on only one of the sides, the offset region 4 and the source/drain region 6 can be formed at the same time.

In the present embodiment, the buffer films 5*k* and 5*l* are provided over the whole region in which an ion implantation is to be carried out. Consequently, the thicknesses of the buffer films 5*k* and 5*l* are set freely so that a quantity of the impurity implantation into each portion in the semiconductor substrate 1 can be changed.

<Twelfth Embodiment>

The present embodiment is a variant of the fourth embodiment, in which a film is formed and is then etched to reduce a thickness thereof, and patterning is thereafter carried out to form a buffer film. Thus, the buffer film is constituted by a plurality of regions having different thicknesses.

FIGS. 46 to 51 are views showing a method of manufacturing a semiconductor device according to the present embodiment. First of all, a semiconductor substrate 1 such as a silicon substrate having an isolation region 2 and an MIS gate structure 3 formed thereon is prepared. A region 1*c* having a high concentration for regulating an impurity concentration of a channel portion is provided under the MIS gate structure 3 in the semiconductor substrate 1. Then, an insulating film 5 such as a silicon oxide film is formed over the whole surface and a photoresist 21 is then formed on the insulating film 5 and is subjected to patterning.

Figure 47:
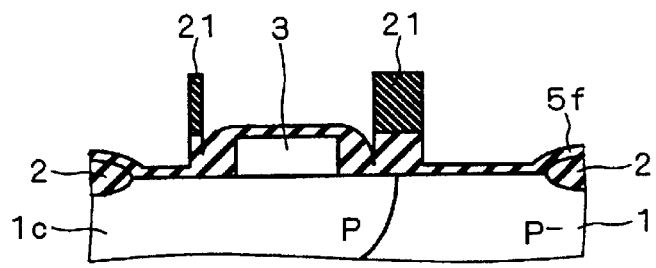

Subsequently, anisotropic etching is carried out by using the photoresist 21 as a mask so that the insulating film 5 is subjected to patterning selectively. Differently from the case of the fourth embodiment, a side wall 5*a* and a buffer film are not completely formed in this stage. More specifically, a part of the insulating film 5 is covered with the photoresist 21 and a thickness of the insulating film 5 is simply reduced (FIG. 47).

Figure 48:
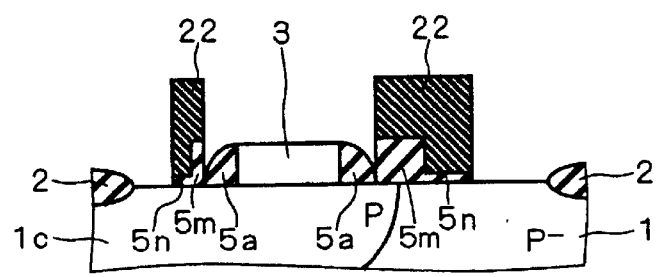

After the photoresist 21 is removed, a photoresist 22 is newly formed such that a portion covered with the photoresist 21 and a thinned film portion adjacent thereto in an insulating film 5*f* having a thickness reduced are selectively subjected to patterning. Then, anisotropic etching is carried out by using the photoresist 22 as a mask so that the insulating film 5*f* is selectively subjected to patterning (FIG. 48). Thereafter, the photoresist 22 is removed. Consequently, a side wall 5*a* and buffer films 5*m* and 5*n* are formed. The buffer films 5*m* and 5*n* are provided on both of two opposed sides of the MIS gate structure 3. Moreover, the buffer film is constituted by the portion 5*m* having a great thickness and the portion 5*n* having a small thickness.

Figure 49:
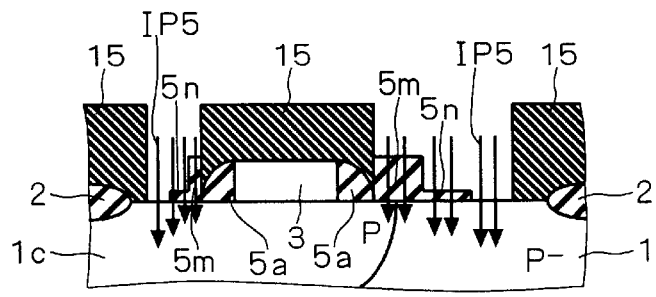

Next, a photoresist 15 to be a mask is formed on the surface of the semiconductor substrate 1 and is subjected to patterning so as to cover a portion in which an impurity should not be implanted. Then, an impurity implantation IP5 is carried out (FIG. 49). The impurity implantation is carried out through the buffer films 5*m* and 5*n* in the portions in which the buffer films 5*m* and 5*n* are provided. Moreover, the impurity implantation is also carried out in outside portions of the buffer films 5*m* and 5*n* seen from the MIS gate structure 3. Consequently, offset regions 4a, 4b and 4c are formed. The offset region 4b has a higher impurity concentration than that of the offset region 4a, and furthermore, the offset region 4c has a higher impurity concentration than that of the offset region 4b.

Figure 50:
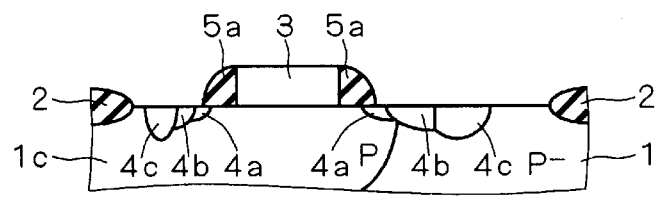
Figure 51:
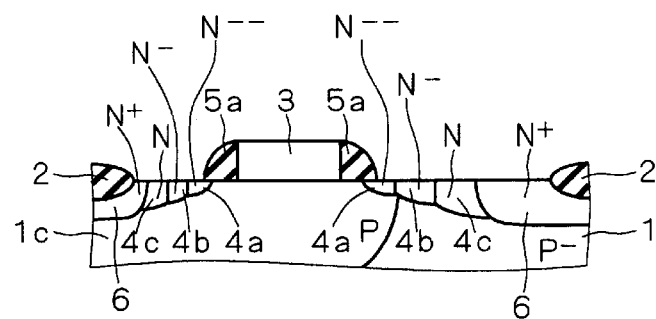

Subsequently, the buffer films 5m and 5n are removed by using the photoresist 15 through wet etching, for example. Then, the photoresist 15 is removed (FIG. 50). In the same manner as in the case of FIG. 19, thereafter, a photoresist is formed over the whole surface and is subjected to patterning to be a mask for forming a source/drain. Subsequently, an impurity implantation is carried out to form a source/drain region 6 (FIG. 51). The source/drain region 6 has a higher impurity concentration than that of the offset region 4c.

According to the method of manufacturing a semiconductor device in accordance with the present embodiment, the insulating film 5 is formed and is then etched to reduce a thickness thereof and the buffer films 5m and 5n are thereafter subjected to patterning. Consequently, a quantity of the impurity implantation can be varied depending on the thickness of the buffer film 5n.

Moreover, the buffer film is constituted by a plurality of regions 5m and 5n having different thicknesses. Accordingly, an impurity concentration is reduced in the portion in which the impurity implantation is carried out through the region 5m having a great thickness, while the impurity concentration is increased in the portion in which the impurity implantation is carried out through the region 5n having a small thickness. Accordingly, a plurality of regions having different impurity concentrations can be formed as offset regions of a high frequency compatible MISFET having a high voltage structure by a one-time impurity implantation so that the number of the impurity implantations can be reduced.

In the present embodiment, moreover, the insulating film 5 is formed over the whole surface of the semiconductor substrate 1 and a part of the insulating film 5 is then covered by a photolithography technique and is then etched to reduce a thickness thereof, and furthermore, the covered part and a part of the thinned film portion are selectively subjected to patterning by the photolithography technique and an etching technique. Consequently, the buffer films 5m and 5n are formed. Accordingly, it is possible to easily form a plurality of regions 5m and 5n having different thicknesses on the buffer films by the photolithography technique and the etching technique.

<Thirteenth Embodiment>

The present embodiment is a variant of the twelfth embodiment, in which the offset regions 4a to 4c having a plurality of differences in a concentration in the twelfth embodiment are reduced to two regions.

Figure 52:
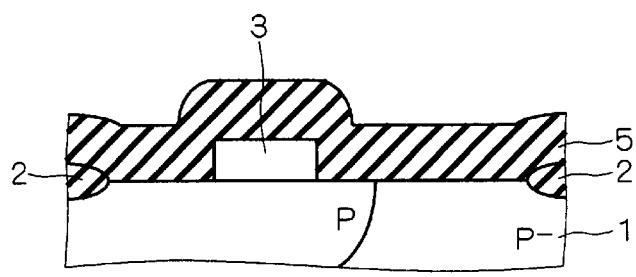
FIGS. 52 to 55 are views showing a method of manufacturing a semiconductor device according to a thirteenth embodiment.
Figure 53:
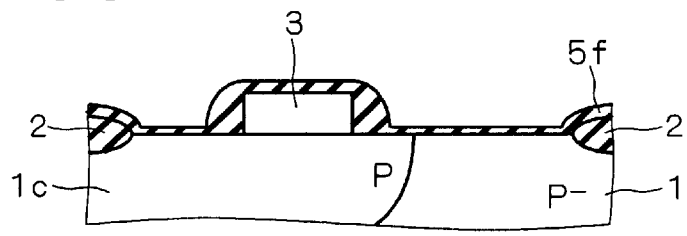

FIGS. 52 to 55 are views showing a method of manufacturing a semiconductor device according to the present embodiment. First of all, a semiconductor substrate 1 such as a silicon substrate having an isolation region 2 and an MIS gate structure 3 formed thereon is prepared. Then, an insulating film 5 such as a silicon oxide film is formed over a whole surface (FIG. 52). Subsequently, anisotropic etching is carried out to reduce a thickness of the insulating film 5 (FIG. 53).

Figure 54:
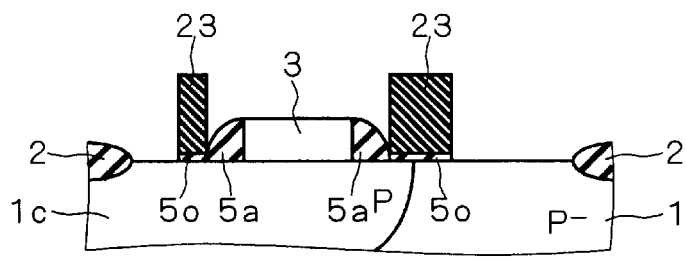

Then, a photoresist 23 is newly formed such that a portion which is adjacent to the MIS gate structure 3 in an insulating film 5f having a thickness reduced is selectively subjected to patterning. Thereafter, anisotropic etching is carried out by using the photoresist 23 as a mask so that the insulating film 5f is selectively subjected to patterning (FIG. 54). Subsequently, the photoresist 23 is removed. Consequently, a side wall 5a and a buffer film 5o are formed. The buffer film 5o is provided on both of two opposed sides of the MIS gate structure 3.

Figure 55:
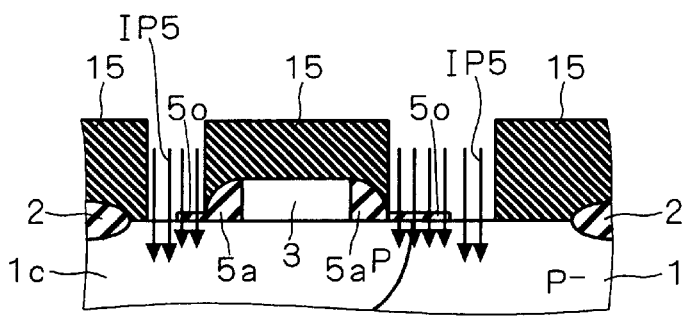

Next, a photoresist 15 to be a mask is formed on the surface of the semiconductor substrate 1 and is subjected to patterning so as to cover a portion in which an impurity should not be implanted. Then, an impurity implantation IP5 is carried out (FIG. 55). The impurity implantation is carried out through the buffer film 5o in the portion in which the buffer film 5o is provided. Moreover, the impurity implantation is also carried out in an outside portion of the buffer film 5o seen from the MIS gate structure 3.

Subsequently, the buffer film 5o is removed by using the photoresist 15 through wet etching, for example. Then, the photoresist 15 is removed. Consequently, offset regions 4a and 4b are formed and the same structure as that in FIG. 18 is obtained. In the same manner as in the case of FIG. 19, thereafter, a photoresist is formed over the whole surface and is subjected to patterning to be a mask for forming a source/drain. Subsequently, an impurity implantation is carried out to form a source/drain region 6. Consequently, the same structure as that in FIG. 20 is obtained.

According to the method of manufacturing a semiconductor device in accordance with the present embodiment, a film is formed over the whole surface of the semiconductor substrate 1 and is then subjected to patterning selectively by a photolithography technique and an etching technique so that the buffer film 5o is formed. Accordingly, the buffer film 5o can be formed in only a necessary portion.

Moreover, the insulating film 5 is formed and is then etched to reduce a thickness thereof and the buffer film 5o is thereafter subjected to patterning. Consequently, a quantity of the impurity implantation can be varied depending on the thickness of the buffer film 5o.

<Fourteenth Embodiment>

The present embodiment is a variant of the thirteenth embodiment, in which the offset regions 4a and 4b having a difference in a concentration in the thirteenth embodiment are further reduced to one region.

Figure 56:
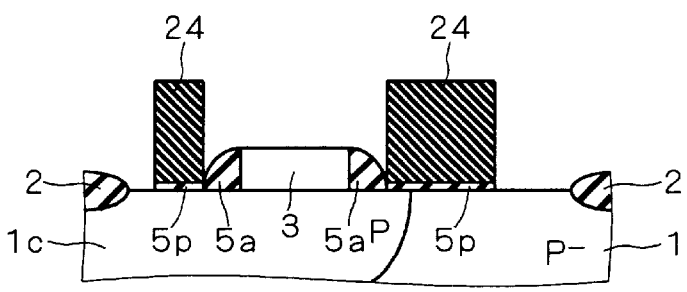
FIGS. 56 and 57 are views showing a method of manufacturing a semiconductor device according to a fourteenth embodiment.
Figure 57:
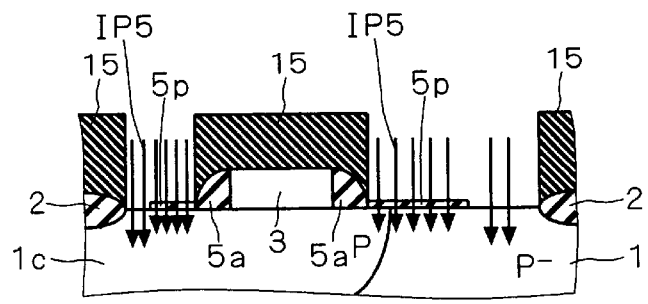

FIGS. 56 and 57 are views showing a method of manufacturing a semiconductor device according to the present embodiment. First of all, the structure shown in FIG. 53 is manufactured in the same manner as in the thirteenth embodiment.

Then, a photoresist 24 is newly formed such that a portion which is adjacent to the MIS gate structure 3 in an insulating film 5f having a thickness reduced is selectively subjected to patterning. Thereafter, anisotropic etching is carried out by using the photoresist 24 as a mask so that the insulating film 5f is selectively subjected to patterning (FIG. 56). Subsequently, the photoresist 24 is removed. Consequently, a side wall 5a and a buffer film 5p are formed. The buffer film 5p is provided on both of two opposed sides of the MIS gate structure 3.

Figure 24:
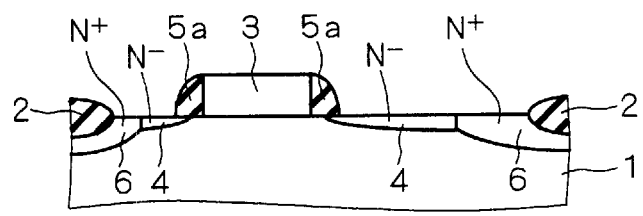

Next, a photoresist 15 to be a mask is formed on a surface of a semiconductor substrate 1 and is subjected to patterning so as to cover a portion in which an impurity should not be implanted. Then, an impurity implantation IP5 is carried out (FIG. 57). The impurity implantation is carried out through the buffer film 5p in the portion in which the buffer film 5p is provided. Moreover, the impurity implantation is also carried out over an outside portion of the buffer film 5p seen from the MIS gate structure 3. Consequently, the same offset region 4 and source/drain region 6 as those in FIG. 24 are formed. The source/drain region 6 has a higher impurity concentration than that of the offset region 4.

If one offset region is thus formed, the offset region 4 and the source/drain region 6 can be formed at the same time and the process can further be reduced.

<Fifteenth Embodiment>

The present embodiment is a variant of the twelfth embodiment, in which a buffer film is constituted by a plurality of regions having different thicknesses and an offset region 4 and a source/drain region 6 can be formed at the same time in the same manner as in the fourteenth embodiment.

Figure 58:
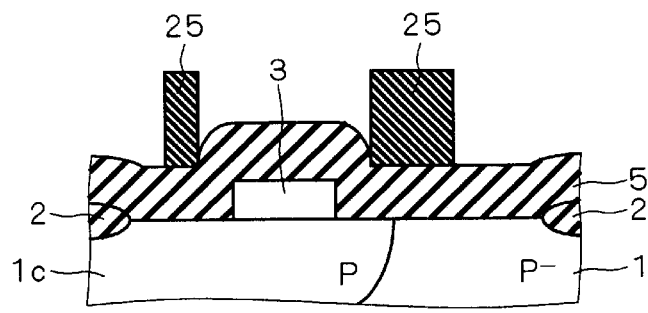
FIGS. 58 to 61 are views showing a method of manufacturing a semiconductor device according to a fifteenth embodiment.

FIGS. 58 to 61 are views showing a method of manufacturing a semiconductor device according to the present embodiment. First of all, a semiconductor substrate 1 such as a silicon substrate having an isolation region 2 and an MIS gate structure 3 formed thereon is prepared. A region 1c having a high concentration for regulating an impurity concentration of a channel portion is provided under the MIS gate structure 3 in the semiconductor substrate 1. Then, an insulating film 5 such as a silicon oxide film is formed over a whole surface and a photoresist 25 is then formed on the insulating film 5 and is subjected to patterning (FIG. 58).

Figure 59:
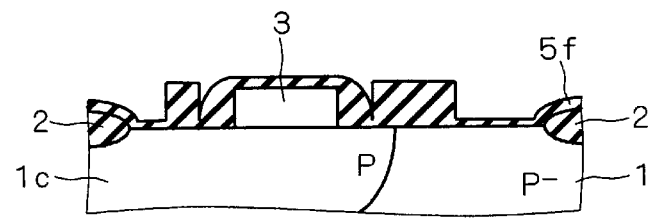

Subsequently, anisotropic etching is carried out by using the photoresist 25 as a mask so that the insulating film 5 is then subjected to patterning selectively. In this stage, a side wall 5a and a buffer film are not completely formed. More specifically, a part of the insulating film 5 is covered with the photoresist 25 and a thickness of the insulating film 5 is simply reduced (FIG. 59).

Figure 60:
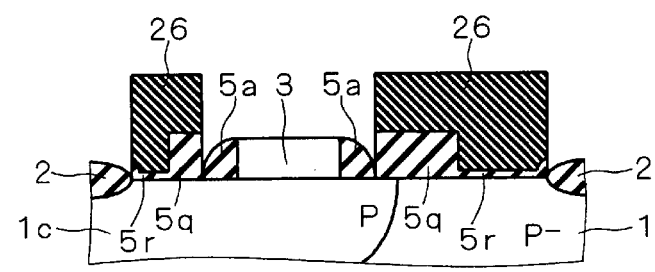

After the photoresist 25 is removed, a photoresist 26 is newly formed such that a portion covered with the photoresist 25 and a thinned film portion adjacent thereto in an insulating film 5f having a thickness reduced are selectively subjected to patterning. Then, anisotropic etching is carried out by using the photoresist 26 as a mask so that the insulating film 5f is selectively subjected to patterning (FIG. 60). Thereafter, the photoresist 26 is removed. Consequently, a side wall 5a and buffer films 5q and 5r are formed. The buffer films 5q and 5r are provided on both of two opposed sides of the MIS gate structure 3. Moreover, the buffer film is constituted by the portion 5q having a great thickness and the portion 5r having a small thickness.

Figure 61:
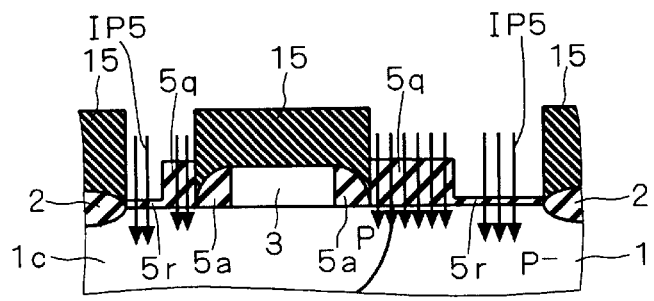
Figure 62:
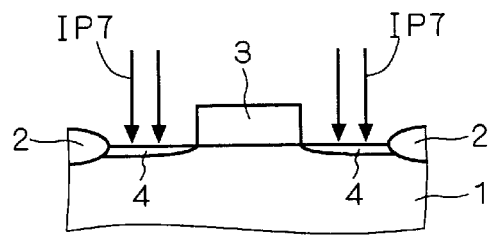

Next, a photoresist 15 to be a mask is formed on the surface of the semiconductor substrate 1 and is subjected to patterning so as to cover a portion in which an impurity should not be implanted. Then, an impurity implantation IP5 is carried out (FIG. 61). The impurity implantation is carried out through the buffer films 5q and 5r in the portions in which the buffer films 5q and 5r are provided. Consequently, the same offset region 4 and source/drain region 6 as those in FIG. 24 are formed. The source/drain region 6 has a higher impurity concentration than that of the offset region 4.

Even if the buffer films 5q and 5r are thus provided on both of the two opposed sides of the MIS gate structure 3, the offset region 4 and the source/drain region 6 can be formed at the same time.

In the present embodiment, the buffer films 5q and 5r are provided over the whole region in which the impurity implantation is to be carried out. Consequently, the thicknesses of the buffer films 5q and 5r are set freely so that a quantity of the impurity implantation into each portion in the semiconductor substrate 1 can be changed.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising the steps of:

(a) preparing a semiconductor substrate having an MIS (Metal Insulator Semiconductor) gate structure formed on a surface of said semiconductor substrate;

(b) providing a buffer film in a first predetermined region of said semiconductor substrate for reducing a quantity of an impurity implantation in said first predetermined region which is adjacent to said MIS gate structure over said surface of said semiconductor substrate;

(c) implanting an impurity into said semiconductor substrate; i) through said buffer film in said first predetermined region in which said buffer film is provided, and ii) directly in a second predetermined region of said semiconductor substrate such that at least two regions of said semiconductor substrate having different impurity concentrations are formed during a one-time impurity implantation; and (d) removing said buffer film.

2. The method of manufacturing a semiconductor device according to claim 1, wherein said first region in which an impurity is implanted through said buffer film is formed as an LDD (Lightly Doped Drain) region of an MISFET.

3. The method of manufacturing a semiconductor device according to claim 1, wherein said first region in which an impurity is implanted through said buffer film is formed as an offset region of an MISFET.

4. The method of manufacturing a semiconductor device according to claim 1, wherein said impurity implantation is also carried out in an outside portion of said buffer film seen from said MIS gate structure.

5. The method of manufacturing a semiconductor device according to claim 1, wherein said buffer film is provided on only one side of said MIS gate structure.

6. The method of manufacturing a semiconductor device according to claim 1, wherein said buffer film is also provided on both of two opposed sides of said MIS gate structure.

7. The method of manufacturing a semiconductor device according to claim 6, wherein a width of said buffer film is varied on each of said two sides.

8. The method of manufacturing a semiconductor device according to claim 1, wherein said buffer film is wholly formed over said surface of said semiconductor substrate and is then subjected to patterning selectively by a photolithography technique and an etching technique.

9. The method of manufacturing a semiconductor device according to claim 8, wherein etching is carried out to reduce a thickness after said film formation and said patterning is then performed.

10. The method of manufacturing a semiconductor device according to claim 1, wherein said buffer film is constituted by a plurality of regions having different thicknesses.

11. The method of manufacturing a semiconductor device according to claim 10, wherein said buffer film is wholly formed over said surface of said semiconductor substrate and a part of said buffer film is then covered by a photolithography technique and is thereafter etched to reduce a thickness thereof, and said covered part and a part of a portion having a thickness reduced are selectively subjected to patterning by using a photolithography technique and an etching technique.

12. The method of manufacturing a semiconductor device according to claim 1, wherein a mask is provided in a portion in which an impurity should not be implanted when said impurity implantation is to be carried out.

* * * * *